United States Patent
Mok et al.

(10) Patent No.: US 7,435,352 B2
(45) Date of Patent: Oct. 14, 2008

(54) METHOD OF FORMING SOLDER RESIST PATTERN

(75) Inventors: Jee-Soo Mok, Chungcheongbuk-do (KR); Jang-Kyu Kang, Daejeon (KR); Chang-Hyun Nam, Chungcheongbuk-do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 104 days.

(21) Appl. No.: 10/677,182

(22) Filed: Oct. 2, 2003

(65) Prior Publication Data

US 2004/0248410 A1    Dec. 9, 2004

(30) Foreign Application Priority Data

Jun. 3, 2003    (KR) .................. 10-2003-0035652

(51) Int. Cl.
*H01B 13/00* (2006.01)
(52) U.S. Cl. .................. 216/13; 216/65; 219/121.6; 219/121.68; 29/831; 29/852; 174/254; 174/260
(58) Field of Classification Search .................. 216/13, 216/65; 174/254, 260; 29/831, 852; 219/121.6, 219/121.68
See application file for complete search history.

(56) References Cited

U.S. PATENT DOCUMENTS

| 4,943,516 | A | * | 7/1990 | Kamayachi et al. ...... 430/280.1 |
| 5,324,535 | A |   | 6/1994 | Ishido |
| 5,447,619 | A | * | 9/1995 | Wolski et al. .................. 205/50 |
| 5,626,774 | A | * | 5/1997 | Paulus .......................... 216/47 |
| 5,837,355 | A | * | 11/1998 | Hayai .......................... 428/209 |
| 5,879,568 | A | * | 3/1999 | Urasaki et al. ................. 216/18 |
| 6,221,972 | B1 | * | 4/2001 | Nakamura et al. ......... 525/327.3 |
| 2002/0007964 | A1 | * | 1/2002 | Mori et al. ................... 174/260 |
| 2002/0026980 | A1 | * | 3/2002 | Nakatani et al. ............. 156/252 |
| 2002/0052062 | A1 | * | 5/2002 | Sakamoto et al. ............ 438/110 |
| 2004/0033746 | A1 | * | 2/2004 | Kurumatani et al. ......... 442/149 |

* cited by examiner

*Primary Examiner*—Shamim Ahmed
(74) *Attorney, Agent, or Firm*—Christensen O'Connor Johnson Kindness PLLC

(57) ABSTRACT

A method for forming a solder resist pattern includes laminating a semi-cured thermosetting film on both sides of a substrate and laser ablating the laminated thermosetting film according to a solder resist mask pattern. The method is applicable to multilayer printed circuit boards, which are fabricated either by the buildup process or the parallel process. Lower manufacturing costs and improved accuracy of the solder resist pattern can be achieved due to the simplified process.

19 Claims, 16 Drawing Sheets

METHOD OF FORMING SOLDER RESIST PATTERN

BACKGROUND OF THE INVENTION

1. Field of the Invention

The present invention relates to a solder resist printing process in the fabrication of a printed circuit board (PCB), and more particularly to a technique for forming a solder resist pattern by laminating a thermosetting film on both sides of a substrate and irradiating a laser beam to the upper surface of the thermosetting film according to a solder mask to selectively remove the thermosetting film.

2. Description of the Related Art

The term 'resist' used herein refers to a film that protects the underlying substrate from a certain treatment or reaction in the fabrication of PCBs. The term 'etching resist' used herein means a film that protects the underlying substrate against etching, and acts to protect conducting parts from a chemical attack. Likewise, the term 'plating resist' means a film that protects a specific area from plating.

The term 'solder' used herein refers to braze. Accordingly, the term 'solder resist' refers to a film that covers a wiring pattern to prevent undesired connections from forming between electrical components due to a brazing during mounting the electrical components on a substrate. The solder resist plays a roll in not only the protection of circuits formed on the surface of a PCB substrate but also the insulation between the circuits, and is generally used in the form of paint.

Since the wiring pattern is formed by etching a copper foil clad on a substrate, it is like bare wires having no insulating cover. As PCBs are highly densified, the spacing between wirings is reduced. This narrow spacing causes problems of short-circuiting and cross connection between adjacent wirings, like electric wires without insulating covers. In particular, when electric parts are mounted on a PCB, they are exposed to molten dust from the PCB surface and thus undesirable solder bridges may occur. These solder bridges lead to important defects which impede normal operation of electronic devices.

In order to prevent these defects, it is necessary to coat the bare wires. The solder resist masks regions other than regions around lands (areas where electric components are mounted), where the electric components are brazed. The solder resist is also referred to as a so-called 'solder mask' in view of its masking function. The process for applying the solder resist on predetermined regions is generally called a 'printing process'.

FIG. 1 shows a basic configuration of a common PCB on which a solder resist is applied. Circuit patterns formed on PCBs are typically very complex. The circuit pattern of FIG. 1 is briefly shown for the purpose of illustration.

After a printed circuit board is fabricated through various processes, regions 12 other than circuit patterns 11 are coated with a solder resist in order to prevent the opening and short-circuiting of the circuit patterns.

A photosensitive resist ink for a solder resist is called a "photo solder resist", abbreviated PSR. The PSR is predominantly green, and is made of a resin having a high resistance even at brazing temperature.

The PSR is cured by ultraviolet (UV) light and heat.

Conventional processes for solder resist printing predetermined regions on a substrate with a circuit pattern formed thereon are accompanied by burial of via holes, application of a PSR, precuring of the PSR and final curing of the PSR, in this order.

Via holes of a PCB into which no components are inserted are buried with the PSR to prevent the oxidation of inner walls of the PCB and to facilitate the handling of the PCB during insertion of components into the PCB. The burial step is carried out by a screen printing process using a screen with a pattern printed thereon. At this time, the printed pattern varies according to the sizes and positions of via holes. The substrate with completely buried via holes is dried in a vertical position in order to prevent ink from flowing out of the via holes. In addition to the burial of via holes by the screen printing process, a photolithography process is available for burying the via holes.

After burying the via holes, the PSR is applied on the entire surface of the substrate. Then, a primary drying process is carried out so as not to damage an ink layer formed during applying the PSR. The application of the PSR is carried out by a process including screen printing, roller coating, curtain coating, spray coating, etc.

The screen printing is a process in which a solder resist pattern is directly printed using a screen, and the solder resist pattern is formed through light-exposure and development.

According to the roller coating process, a PSR is thinly spread over a rubber roller and then coated onto a substrate. At this time, the PSR has a viscosity lower than that used in the screen printing process. The roller coating process has drawbacks that the thickness of a resist to be coated cannot be adjusted depending on the type of substrate used and uniform coating is not easily achieved. In addition, the roller coating process has an optical anisotropy problem.

The optical anisotropy problem occurs when both sides of a semi-transparent substrate are exposed to light. That is, when a light penetrates the substrate, cloudy images are formed on the opposite side. 'Back light exposure' is used as an alternative expression for optical anisotropy.

In the curtain coating process, a PSR having a viscosity lower than that used in the roller coating process is used. According to the curtain coating method, the PSR is discharged through a slit to form a membrane in the form of a curtain, through which a substrate is coated.

The curtain coating process has advantages that very uniform coating quality can be obtained and various sized substrates can be used. However, the curtain coating process has problems of high cost and optical anisotropy.

The spray coating is a process in which a resist ink is sprayed to coat a substrate. According to the spray coating process, the thickness of the coated layer is easy to control. However, the spray coating process has problems of high cost and optical anisotropy.

After applying the PSR, a pattern is formed by closely adhering an artwork film with a solder resist pattern printed thereon to the substrate, exposing to light and developing.

Thereafter, a resin contained in the PSR is cured. When the curing is insufficient, there may be a defect that a PSR resist film is split in the following processes. As mentioned above, the PSR may be thermal curable, UV-curable, thermal plus UV curable composite types, or the like.

FIG. 2 shows an embodiment of a conventional solder resist printing process. Specifically, FIG. 2 is a flowchart showing a process for printing a solder resist of a substrate for an FC-BGA (Flip Chip Ball Grid Array) type package. Referring to FIG. 2, the substrate is a multilayer printed circuit board, and a UV-curable PSR is used as the solder resist.

In step S201, a scrubbing process is carried out on both sides of the substrate to improve the adhesion between the PSR and the substrate.

In step S202, the PSR is applied to wet the substrate. The application of the photo solder resist is carried out by a process including screen printing, roller coating, curtain coating, spray coating, etc.

A first predrying step is carried out (step S203), a second printing step of the PSR is carried out (step 204), and a second predrying step is carried out (step S205). In step S206, a PET resin can be laminated to improve light exposure. Step S206 can be omitted. The substrate is exposed to UV light to cure a film (step S207), and then developed (step S208).

In step S209, a post-exposure step is carried out to promote a crosslinking reaction in the film. In step S210, a final drying is carried out to remove solvents, etc., and finally the printing process of the solder resist is completed.

As discussed above, conventional solder resist printing processes require a number of steps.

In addition, the conventional solder resist printing processes have a problem that inflow of foreign materials is likely to happen during the printing. The inflow of foreign materials originates from the used wet ink.

In a conventional process using a photosensitive solder resist ink, foreign materials may enter during light exposure to remove a solder resist on desired regions parts.

Furthermore, unsuitable drying conditions in the drying steps can cause the non-uniform colors of a solder resist to be printed.

SUMMARY OF THE INVENTION

Therefore, the present invention has been made in view of the above problems, and it is an object of the present invention to provide a method for forming a solder resist pattern which is capable of replacing the above conventional solder resist printing processes.

It is another object of the present invention to provide a method for forming a solder resist pattern in the fabrication of a multilayer printed circuit board which can be performed in a simple manner and with time- and cost-effectiveness, compared to conventional solder resist printing processes.

It is yet another object of the present invention to provide a method for forming a solder resist pattern in the fabrication of a multilayer printed circuit board which can be performed in a simple manner and with time- and cost-effectiveness, compared to conventional solder resist printing processes, wherein the multilayer printed circuit board is fabricated in a parallel manner.

In order to accomplish the above objects of the present invention, there is provided a method for forming a solder resist pattern comprising the steps of:

pre-treating both sides of a double-sided printed circuit board;

laminating a semi-cured thermosetting film on the both sides of the printed circuit board; and irradiating a laser beam to the laminated thermosetting film according to a solder resist mask pattern to selectively remove the thermosetting film according to the solder resist mask pattern having been previously designed prior to irradiating.

Preferably, the pretreating step in the method for forming a solder resist pattern of the present invention, includes scrubbing.

More preferably, the method for forming a solder resist pattern of the present invention further comprises curing the semi-cured thermosetting film after laminating the semi-cured thermosetting film on the both sides of the printed circuit board.

A method for forming a solder resist pattern according to a preferred embodiment of the present invention comprises pretreating a portion exposed from a plurality of layers constituting a multilayer printed circuit board, laminating a thermosetting film on the pretreated portion, and irradiating a laser beam to the laminated thermosetting film according to a solder resist mask pattern to selectively remove the thermosetting film.

Preferably, the pretreating step in the method for forming a solder resist pattern according to the preferred embodiment of the present invention includes scrubbing.

More preferably, the method for forming a solder resist pattern according to the preferred embodiment of the present invention further comprises curing the semi-cured thermosetting film after laminating the semi-cured thermosetting film.

A method for forming a solder resist pattern according to another preferred embodiment of the present invention comprises pretreating a portion exposed from a plurality of layers constituting a multilayer printed circuit board fabricated in a parallel manner, laminating a thermosetting film on the pretreated portion, and irradiating a laser beam to the laminated thermosetting film according to a solder resist mask pattern to selectively remove the thermosetting film.

Preferably, the pretreating step in the method for forming a solder resist pattern according to the preferred embodiment of the present invention includes scrubbing.

More preferably, the method for forming a solder resist pattern according to the preferred embodiment of the present invention further comprises curing the semi-cured thermosetting film after laminating the semi-cured thermosetting film.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, the present invention will be explained in more detail with reference to the accompanying drawings.

Figure 1:
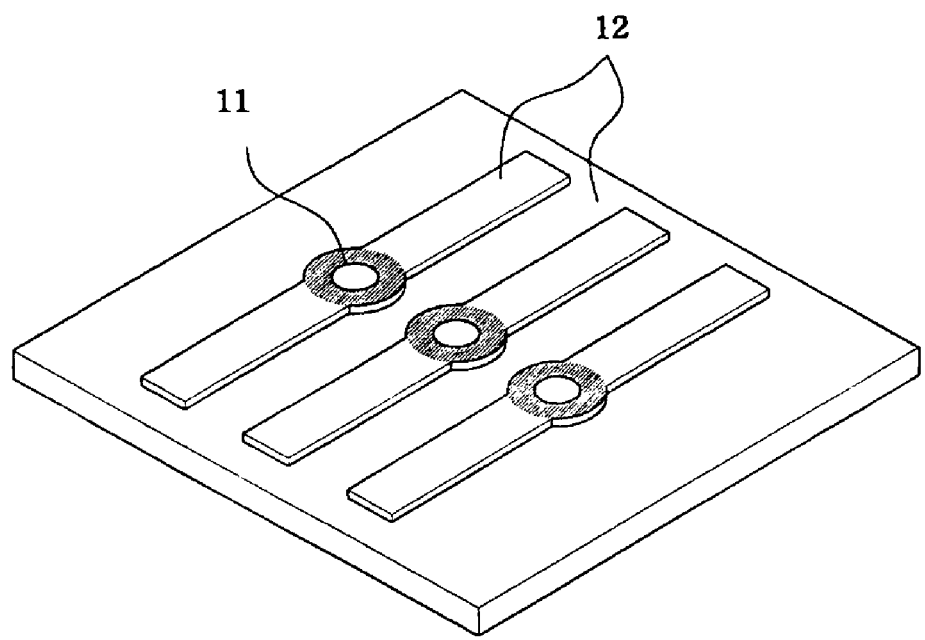
FIG. 1 shows a basic configuration of a common PCB on which a solder resist is applied.
Figure 2:
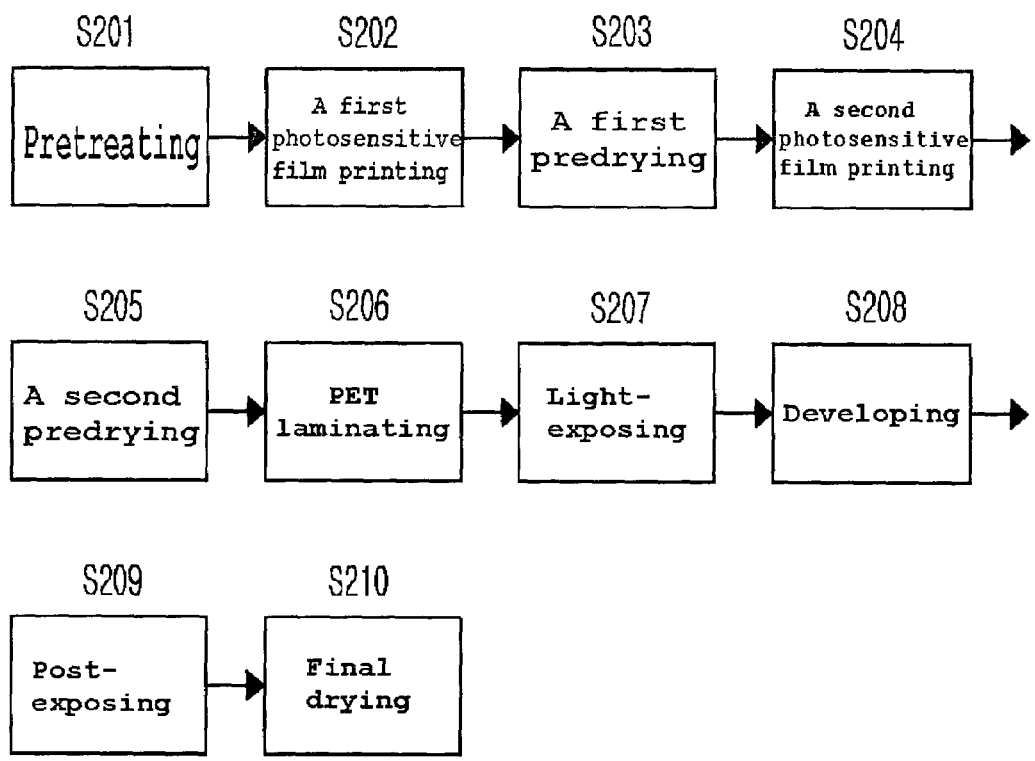
FIG. 2 is a flowchart showing a conventional solder resist printing process.
Figure 3:
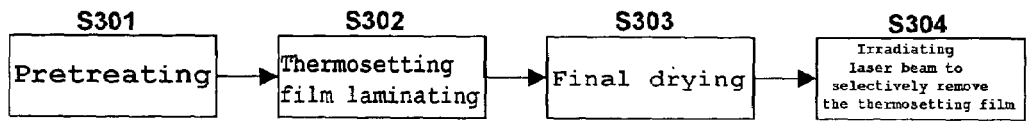
FIG. 3 is a flowchart showing a method for forming a solder resist pattern according to the present invention.

A flowchart showing a method for forming a solder resist pattern of the present invention is shown in FIG. 3.

In step S301, a scrubbing process is carried out to improve the adhesion between an insulating thermosetting solder resist film and a substrate.

When fingerprints, oil, dust, etc., are stuck on the substrate, a solder resist ink is not closely adhered to the substrate, causing a problem of low adhesion. In addition, the incomplete adhesion causes non-uniform plating thickness during plating process, which leads to cutting of wirings or short-circuiting between adjacent wirings. Accordingly, it is necessary to clean the surface of the substrate in order to prevent the defects. The cleaning operation is called a 'scrubbing'. The reason for the scrubbing is to roughen the surface of the substrate and to facilitate the lamination on the substrate.

Examples of processes for carrying out the scrubbing include chemical treatments, mechanical treatments and combinations thereof. The chemical treatment uses a chemical to clean a substrate surface. The mechanical treatment uses a polishing brush without using chemicals. The combined treatment is the most commonly used process, and carried out by treating a substrate surface with an acid to remove oxides, fingerprints, oil and fat, etc., and mechanically scrubbing the substrate surface using a brush to roughen the substrate surface.

More specifically, the chemical scrubbing is carried out to clean the surface of a copper foil using a chemical. Examples of the chemical scrubbing include a soft etching, a chemical cleaning, an acid treatment, etc.

The soft etching process uses a soft etching solution of $H_2O_2$ and $H_2SO_4$ to carry out the scrubbing. This process has an advantage of excellent cleaning effect but a disadvantage of low roughness uniformity. When a soft etching solution of $Na_2SO_4$ and $H_2SO_4$ is used, uniform surface treatment is possible but the scrubbing effect is maintained only for a short time.

The chemical cleaning process is carried out by soft etching following an acid washing.

The acid treating process uses 5~10% sulfuric acid.

The mechanical scrubbing process is carried out using a polishing brush without using chemicals. Examples of the mechanical scrubbing process include brushing, polishing, jet scrubbing, etc.

The brushing process is carried out by cleaning a substrate surface with various brushes to roughen the substrate surface. The polishing process is carried out by polishing a nylon-made brush while spraying polishing particles on a substrate. The jet scrubbing process is carried out by spraying particles such as aluminum oxide ($Al_2O_3$) at high pressure on a substrate surface without using brushes.

The jet scrubbing process is the most preferable in terms of the roughness uniformity, while the polishing process is the most preferable in terms of surface cleaning effect.

The combined process of the mechanical and the chemical processes includes combinations of brushing and soft etching processes, soft etching and brushing processes, and acid treatment and brushing processes, etc.

The combined process of brushing and soft etching processes is carried out by treating a substrate surface with a chemical following scrubbing of the substrate surface using a brush. The combined process can improve the roughness uniformity and softness, but has a drawback of low adhesion of a dry film to the substrate surface. The combined process of soft etching and brushing processes is carried out by scrubbing a copper foil using a chemical to roughen the copper foil, followed by removing contaminants resulting from the chemical treatment using a brush. The combined process of acid treating and brushing processes is the most widely used one. According to the combined process, an acid treatment is first carried out to remove fingerprints, oil and fat, etc., and then a substrate surface is scrubbed by a brush to roughen the substrate surface.

After scrubbing, it is common to wash and remove contaminants such as chemicals or polishing materials remaining on the copper foil laminate with water. The washed substrate is completely dried in a dryer annexed to a water washer. A water-removing roller can be used instead of an air-knife. The water-removing roller is mainly made of a hydrophilic porous elastomer using PVA (polyvinyl alcohol) as a raw material.

The pressure of the brush, kinds and types of the brush, speed of a conveyor, concentration of the chemical, etc., are important factors for the scrubbing.

In step S302, the thermosetting solder resist film is laminated.

Thereafter, a final drying is carried out in step S303. In step S304, a laser beam is irradiated to the laminated thermosetting film according to a solder resist mask pattern to selectively remove only a portion exposed from the thermosetting film.

Figure 4A:
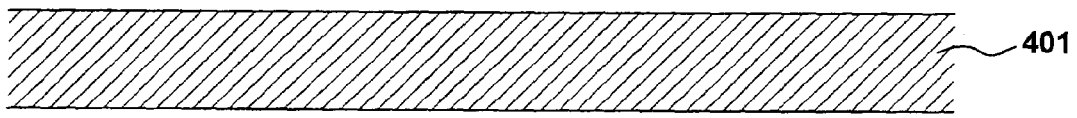
FIGS. 4a to 4c show a method for forming a solder resist pattern according to the present invention.
Figure 4B:
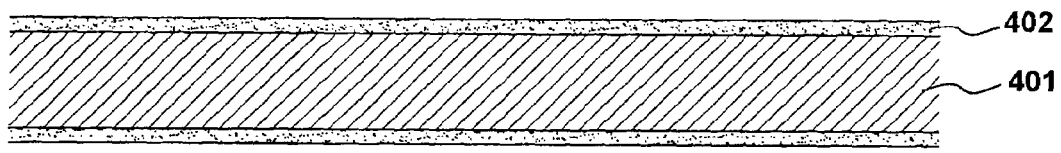
Figure 4C:
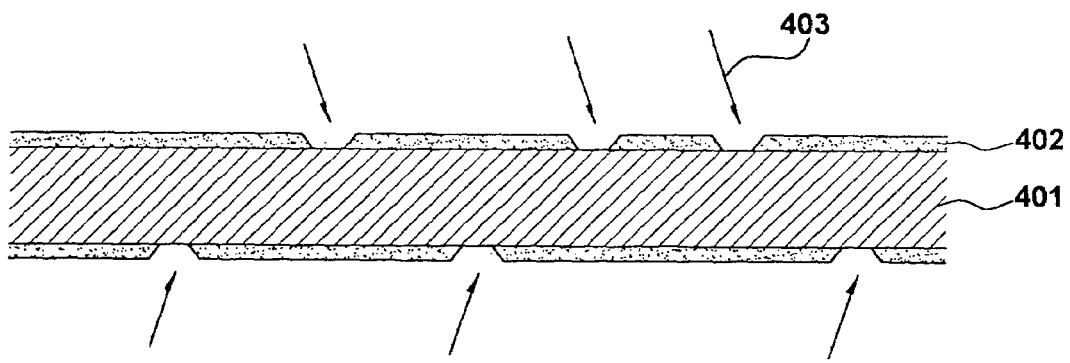

In the fabrication of a double-sided printed circuit board, the method for forming a solder resist pattern of the present invention is shown in FIGS. 4a to 4c.

FIG. 4a shows a double-sided PCB 401 in which a circuit pattern has been formed.

First, the double-sided PCB 401 is scrubbed as described above.

Referring to FIG. 4b, an insulating thermosetting solder resist is applied onto both sides of the substrate to form solder resist films. Referring to FIG. 4c, the solder resist films 402 are selectively removed according to a solder resist pattern by irradiating a laser beam to the solder resist films 402.

At this step, the laser beam is irradiated by a laser-processing apparatus. The laser-processing apparatus can be the same one as used for the process for forming the via holes of the circuit layer, as described above. Specifically, the above laser beam can be any one of YAG (yttrium aluminum garnet) laser, excimer laser and $CO_2$ laser.

Examples of methods for fabricating a multilayer printed circuit board (MLB) include a build-up process in which layers are laminated layer-by-layer, and a batch laminating process or parallel process in which a circuit layer and an insulating layer are separately formed, and the layers are alternatively disposed and pressed using a press.

According to an embodiment of the present invention, there is provided a solder resist printing process in a multilayer printed circuit board fabricated in accordance with the build-up process.

Figure 5A:
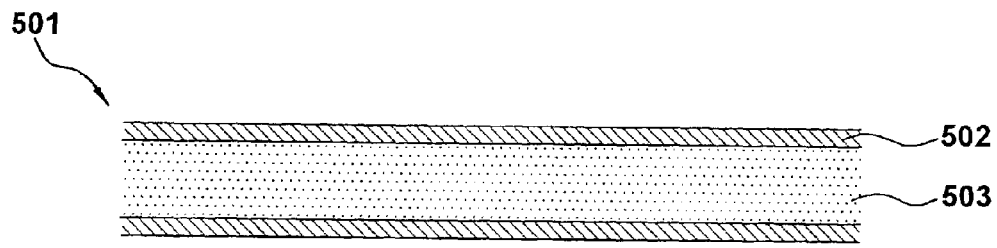
FIGS. 5a to 5o show a method for forming a solder resist pattern of an MLB fabricated in a build-up process, in accordance with an embodiment of the present invention.
Figure 5B:
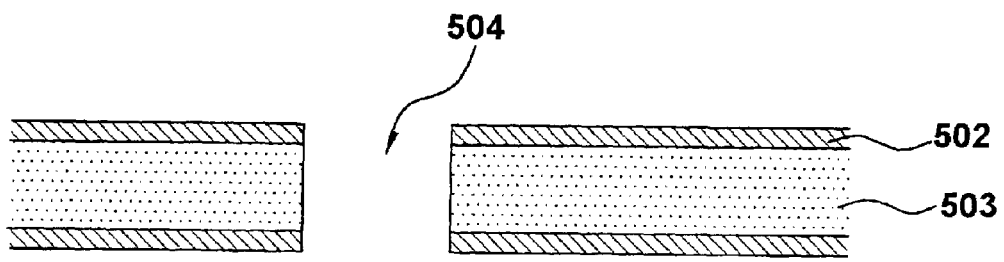
Figure 5C:
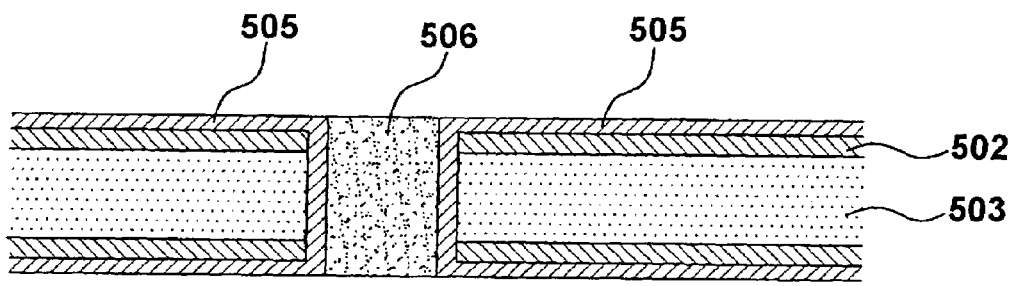
Figure 5D:
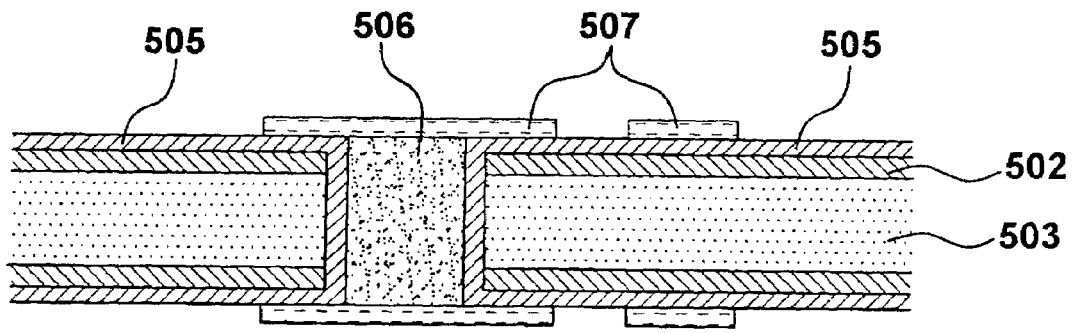
Figure 5E:
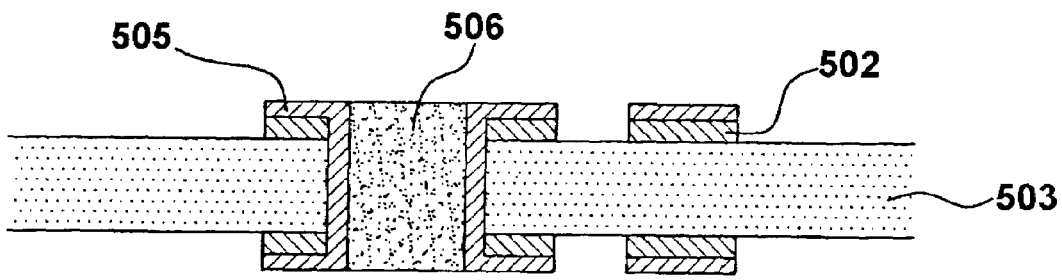
Figure 5F:
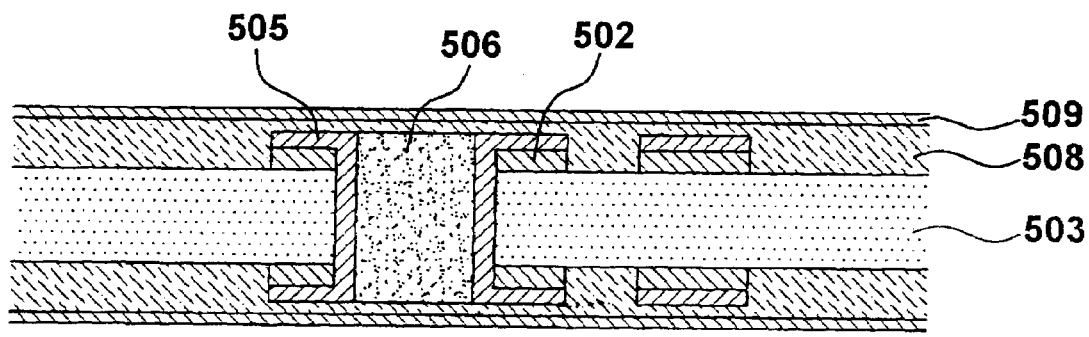
Figure 5G:
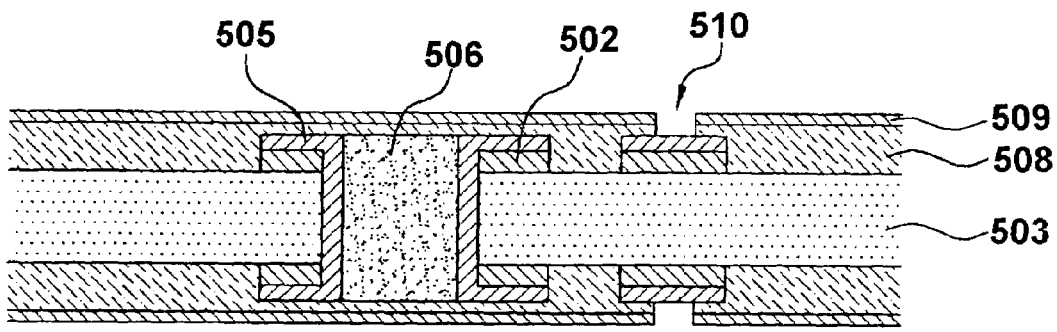
Figure 5H:
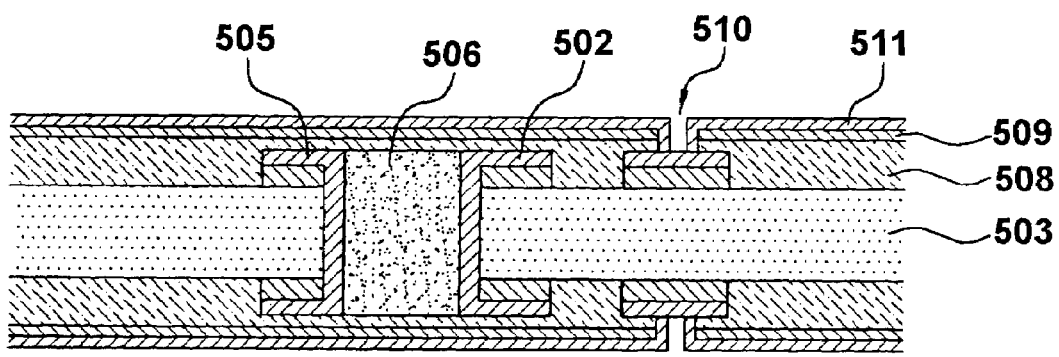
Figure 5I:
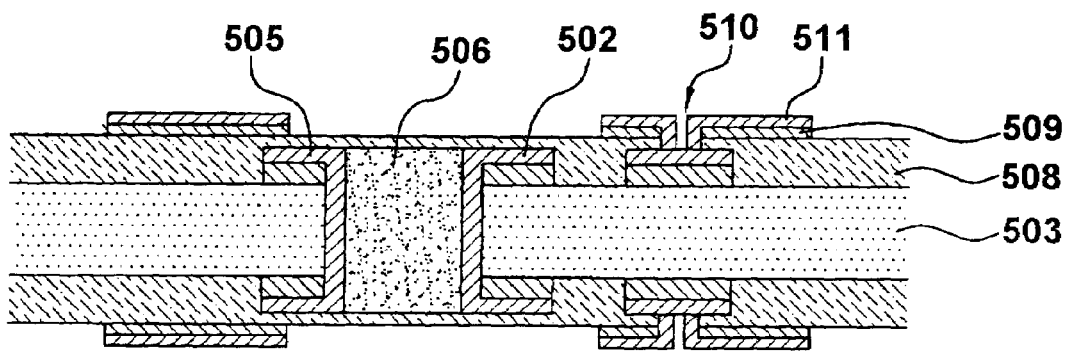
Figure 5J:
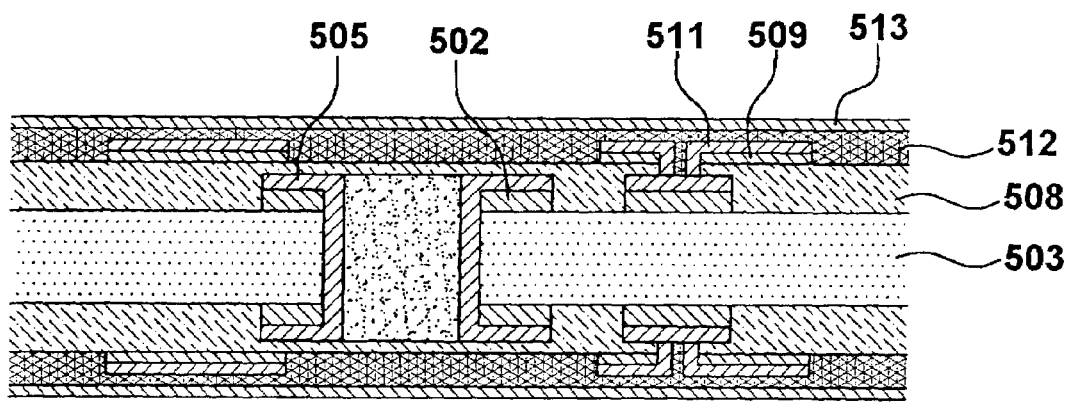
Figure 5K:
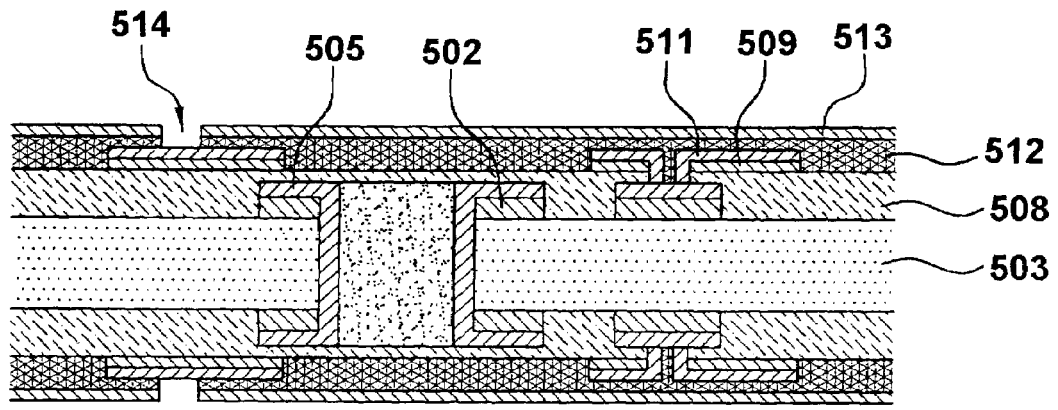
Figure 5L:
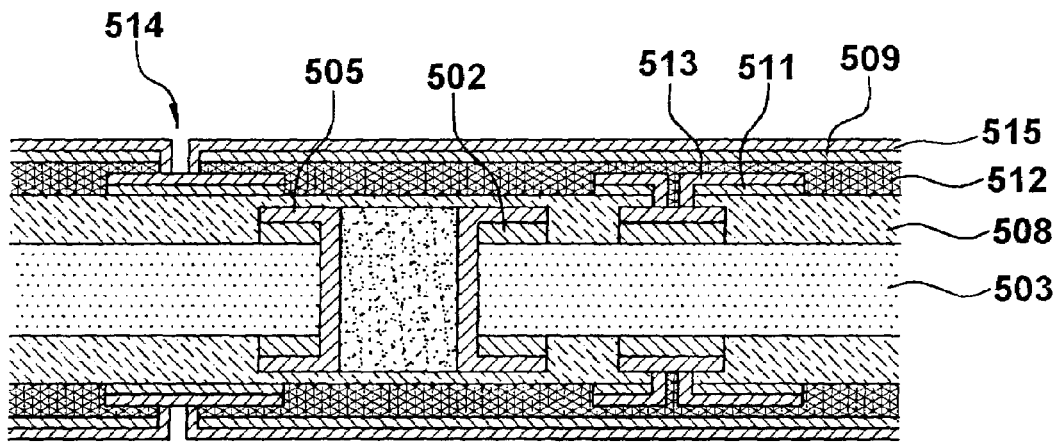
Figure 5M:
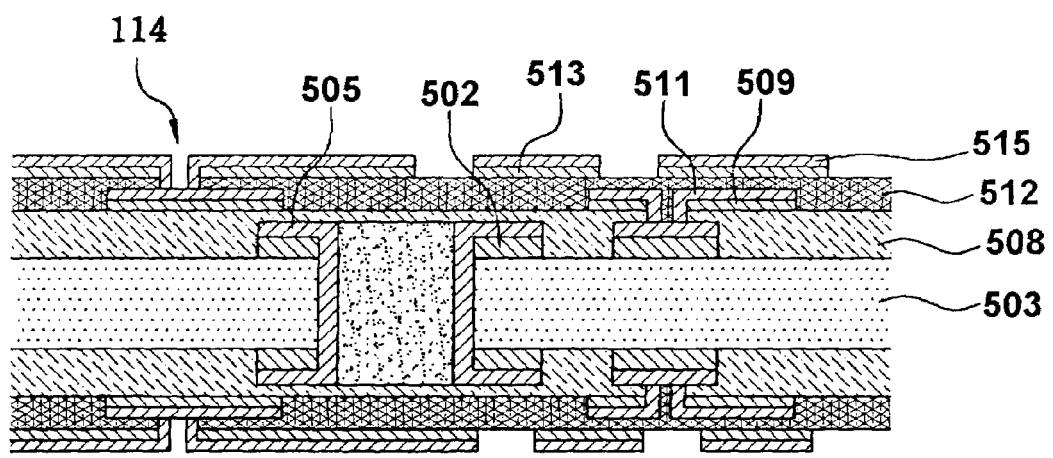
Figure 5N:
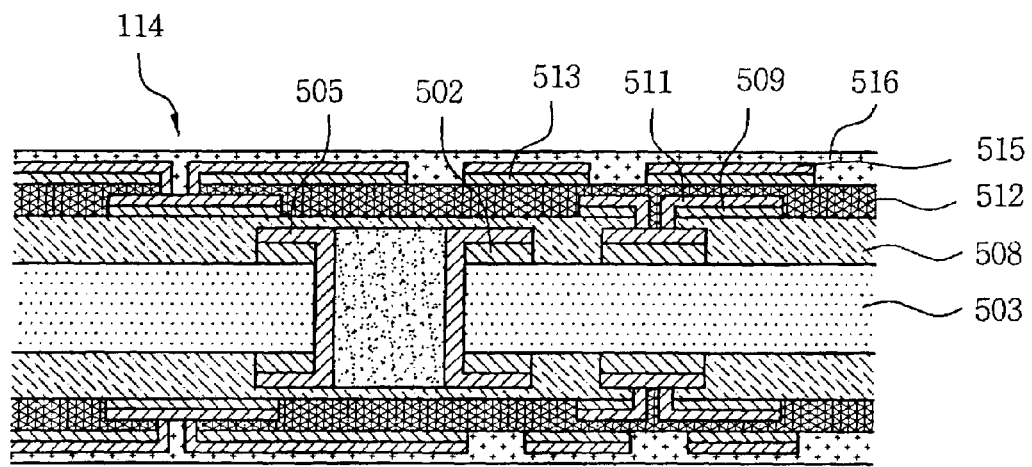
Figure 5O:
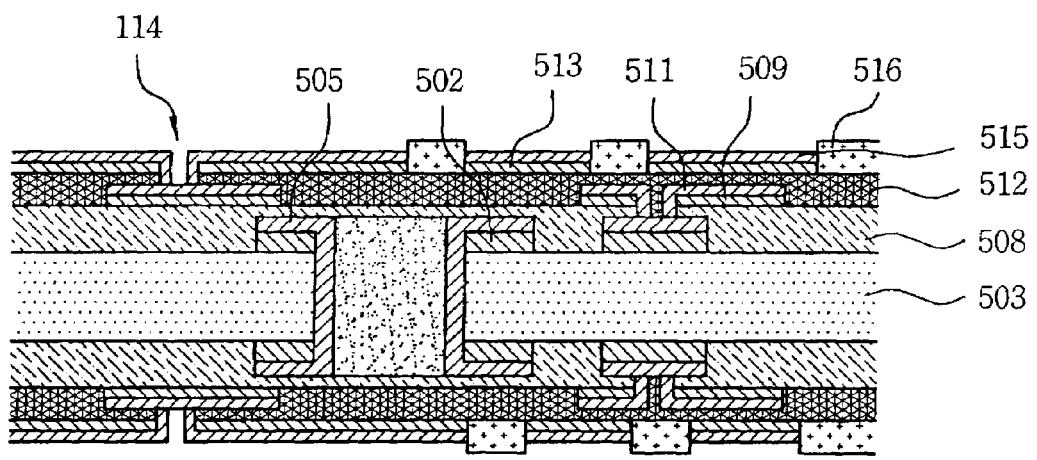

FIGS. 5a to 5o show a method for fabricating a 6-layered MLB fabricated in accordance with the build-up process.

The build-up process is a process in which an inner layer is first formed and then outer layers are laminated layer-by-layer thereon.

FIG. 5a is a cross-sectional view showing a copper clad laminate (CCL) 501 prior to any processing operations. The copper clad laminate is generally a laminate prepared by thinly cladding an insulating layer with a copper foil. Here, the copper clad laminate (CCL) 501 is prepared by thinly cladding the insulating layer 503 with the copper foil 502.

The copper clad laminate varies depending on its applications. For example, a glass/epoxy copper clad laminate, a heat resistant resin copper clad laminate, a paper/phenol copper clad laminate, a high frequency copper clad laminate, a flexible copper clad laminate (polyimide film) and a composite copper clad, etc. To fabricate double-sided PCBs and multilayer PCBs, the glass/epoxy copper clad laminate is usually used.

The glass/epoxy copper clad laminate is prepared from a reinforcing substrate and a copper foil. The reinforcing substrate is obtained by incorporating an epoxy resin (a blend of a resin and a curing agent) into a glass fiber. The glass/epoxy copper clad laminate is classified in accordance with the kinds of the reinforcing substrate. According to classification adopted by the NEMA (National Electrical Manufacturers Association), the glass/epoxy copper clad laminate are graded in accordance with the reinforcing substrates used and their heat resistance, e.g., FR-1~FR-5. FR-4 is the most widely used. Demand for FR-5 is steadily increasing because characteristics of FR-5 such as Tg (glass transition temperature) are improved.

Referring to FIG. 5b, the copper clad laminate 501 is drilled to form a via hole 504 for an interlayer connection.

Referring to FIG. 5c, an electroless copper-plating and an electro copper-plating are carried out. At this step, the electroless copper-plating is first carried out, and the electro copper-plating follows. Because the electro copper-plating requires application of electricity, it cannot be carried out on the insulating layer. Accordingly, the electroless copper-plating is first carried out. That is, the electroless copper-plating is carried out to form a conductive layer required for the electro copper-plating. Since the electroless copper-plating has disadvantages of difficult treatment and low economic efficiency, conductive regions of a circuit pattern are preferably formed through the electro copper-plating.

Thereafter, the via hole 504 is filled up with a paste 506 in order to protect electroless copper-plating layers and electro copper-plating layers 505 formed in inner walls of the via hole 504. The paste is commonly made of an insulating ink material. The paste may be conductive depending on the applications of the printed circuit board. The conductive paste is prepared by mixing a metal such as Cu, Ag, Au, Sn and Pb or an alloy thereof as a main component with an organic adhesive. However, the filling of the paste can be omitted depending on the purposes of MLB fabrication.

Referring to FIG. 5c, the electroless copper-plating layers and the electro copper-plating layers 505 are shown without distinction for the purpose of illustration.

Referring to FIG. 5d, a pattern of etching resists 507 for forming a circuit of the inner layer is formed.

A circuit pattern printed in an artwork film must be transferred onto the substrate to form a resist pattern. This transfer is carried out by various manners. As the most frequently used manner, a circuit pattern printed in an artwork film by an ultraviolet light is transferred onto a dry film. An LPR (liquid photo resist) may be used instead of the dry film.

The dry film or LPR onto which a circuit pattern is transferred acts as the etching resists 507. Following etching of the substrate, the etching resists 507 are removed to form a circuit pattern shown in FIG. 5e.

After forming the circuit pattern, the appearance of the circuit is examined using a method such as an automatic optical inspection (AOI). The examination is performed to see if the inner layer circuit is well formed. Following the examination, a surface treatment such as black oxide treatment is carried out.

The AOI (automatic optical inspection) is to automatically examine the appearance of PCBs. The AOI uses an image sensor and computerized technique for recognizing formed patterns. According to the AOI, pattern information of a circuit to be examined is inputted using the image sensor, and then the inputted pattern information is compared with reference data to identify faults.

Using the AOI, a minimum value of an annular ring of a land (an area where electric components are mounted and the grounding state of a power can be examined. Furthermore, the width between wiring patterns can be measured and the omission of holes can be detected. It is impossible, however, to examine the inner state of holes.

The black oxide treatment is carried out to improve adhesive strength and heat resistance before closely attaching the inner layer in which a wiring pattern is formed to the outer layers.

Referring to FIG. 5f, RCC (resin coated copper) is laminated on both sides of the substrate. The RCC is a substrate in which a copper foil layer 509 is formed on only one face of a resin layer 508. The resin layer 508 acts as an insulator between circuit layers.

Referring to FIG. 5g, blind via holes 510 are formed which act as an electrical connector between the inner layer and the outer layers. The blind via holes may be formed using a mechanical drill, and preferably YAG laser or $CO_2$ laser. The formation of the blind via holes requires more precise processing than the formation of through holes. The YAG laser is a laser capable of processing both the copper foil layer and the insulating layer, while the $CO_2$ laser is a laser capable of processing only the insulating layer.

Referring to FIG. 5h, the outer layers 511 are laminated to the RCC through a plating process.

Referring to FIG. 5i, a circuit pattern is formed on the laminated outer layers 511 using the same method as in the method for forming the circuit pattern on the inner layer as described above. Then, a circuit examination and a surface treatment are carried out on the outer layers 511, like the circuit pattern of the inner layer as described above.

Referring to FIG. 5j, the RCC is laminated on both sides of the substrate to further form outer layers. The RCC is a substrate in which a copper foil layer 513 is formed on only one face of a resin layer 512. The resin layer 512 acts as an insulator between circuit layers.

Referring to FIG. 5k, blind via holes 514 are formed which act as an electrical connector between the outer layers and additional outer layers.

Referring to FIG. 5l, additional outer layers 515 are laminated through a plating process.

Referring to FIG. 5m, a circuit pattern is formed on the additional outer layers 515 using the same method as described above. Then, a circuit examination and a surface treatment are carried out on the additional outer layers 515.

Referring to FIG. 5n, exposed portions (515 or 512) are pretreated by scrubbing, and then a solder resist 516 is applied thereon.

Referring to FIG. 5o, portions exposed from the applied solder resist 516 are selectively removed according to a solder resist mask pattern by a laser beam.

In another preferred embodiment of the present invention, there is provided a solder resist printing method in the fabrication of a multilayer printed circuit board wherein the multilayer printed circuit board is fabricated in a parallel manner.

FIGS. 6a to 6f show a method for forming a circuit layer constituting a multilayer printed circuit board fabricated in a parallel manner. Referring to FIGS. 6a to 6f, via holes are first formed and then the via holes are buried by a plating process to form the circuit layer.

Figure 6A:
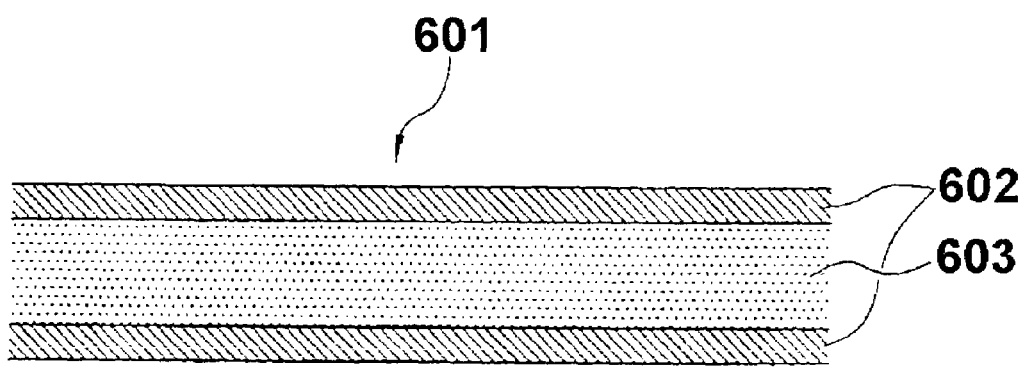
FIGS. 6a to 6f show a method for forming a circuit layer in a printed circuit board fabricated in a parallel manner.

A common copper clad laminate 601 is shown in FIG. 6a, and an insulating layer 603 is clad with a copper foil 602.

As shown above, the copper clad laminate varies depending on its applications. In this embodiment, a 3-5 µm thick copper foil is used. Since a mechanical drilling or laser drilling allows through holes to have a relatively small diameter, the copper foil may have a relatively small thickness.

Figure 6B:
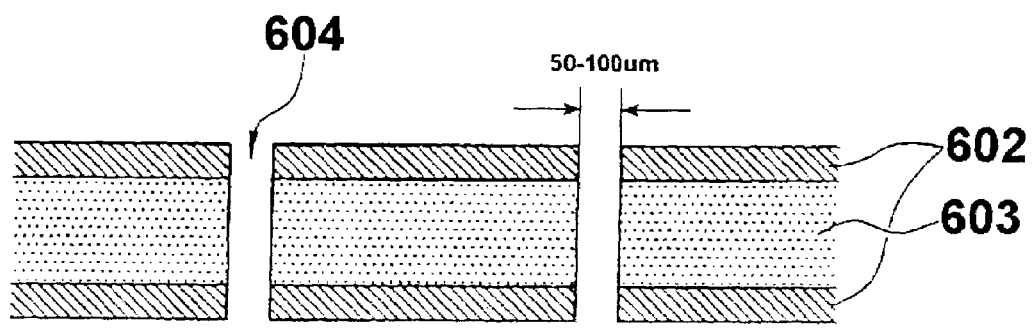

Referring to FIG. 6b, through holes 604 are formed on the copper clad laminate. The through holes are formed at a diameter of about 50-100 µm using YAG laser or $CO_2$ laser.

The diameter of via holes formed in common multilayer printed circuit boards is in the range of 200-300 μm. This small diameter of through holes can eliminate conventional plugging process of a paste.

Figure 6C:
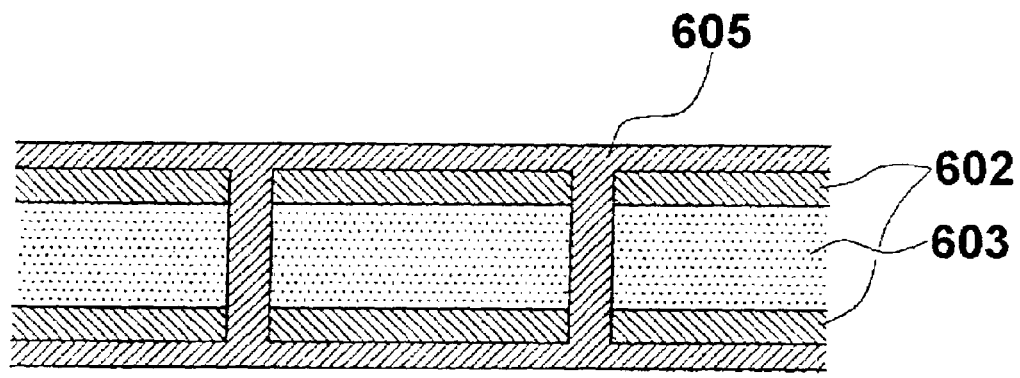

Referring to FIG. 6c, the upper and lower faces of the substrate and inner walls of the through holes are plated by an electroless copper-plating and an electro copper-plating. As shown in FIG. 6c, a plating layer 605 is formed on the upper and lower surfaces of the substrate, and thus the through holes are buried by a plating process without a separate plugging treatment.

Figure 6D:
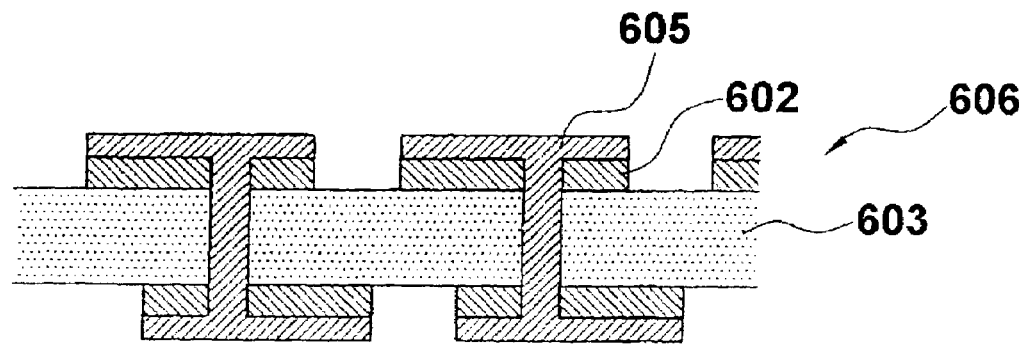

Referring to FIG. 6d, a circuit pattern 606 is formed using a circuit pattern forming process such as etching. The circuit layer 606 thus formed is used as circuit layers 606a, 606b and 606c in the fabrication of a multilayer printed circuit board as described below (see FIG. 9). A thermosetting solder resist is laminated on the outermost surfaces of the circuit layers 606a and 606c.

Figure 6E:
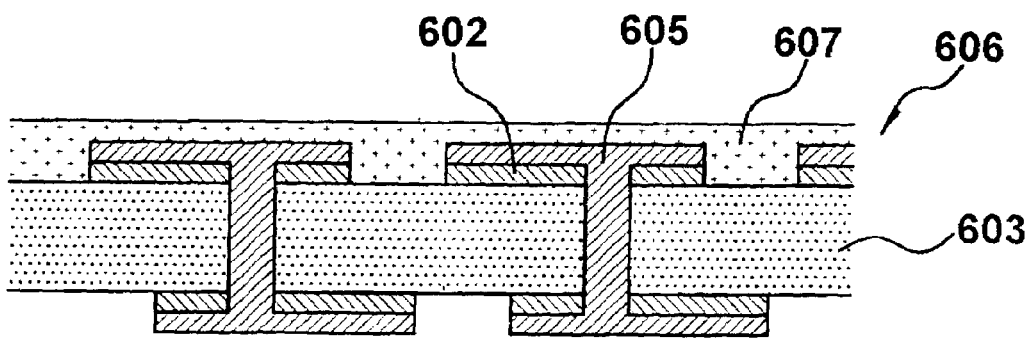

Referring to FIG. 6e, a solder resist 607 is applied on the substrate, which will be used as an outermost layer of a multilayer printed circuit board in a parallel manner.

Figure 6F:
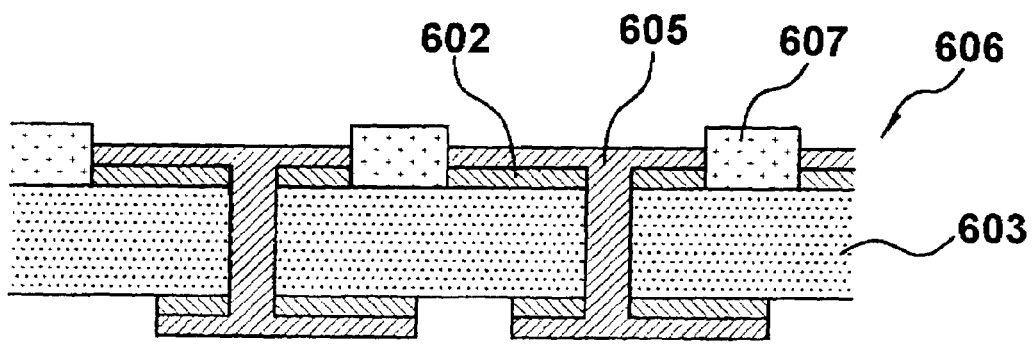

Referring to FIG. 6f, regions other than the circuit pattern of the applied solder resist 607 regions are removed by irradiating a laser beam to form a circuit layer 606. The circuit layer 606 thus formed is used as an outermost layer of a multilayer printed circuit board fabricated in a parallel manner. In the fabrication of the multilayer printed circuit board in a parallel manner, it is preferred that a solder resist pattern is formed on an outer layer before laminating on a substrate, rather than a solder resist is applied and then removed after laminating on the substrate.

FIGS. 7a to 7d show a method for forming an insulating layer constituting a multilayer printed circuit board in a multilayer printed circuit board fabricated in a parallel manner.

Figure 7A:
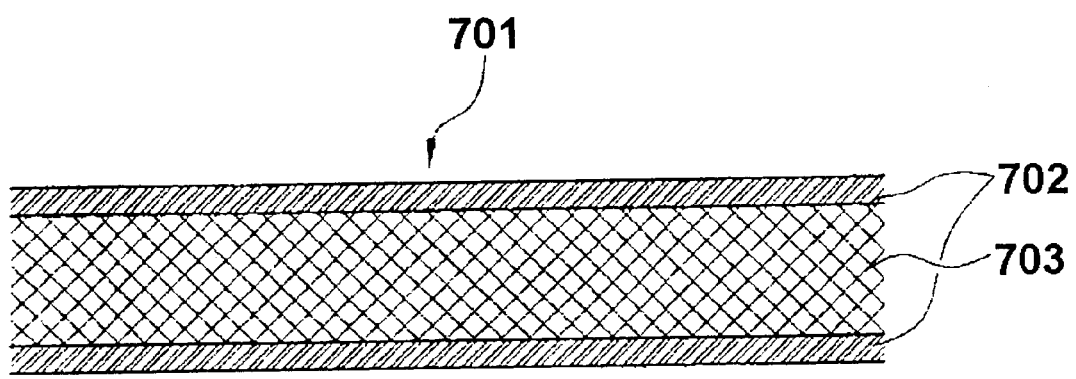
FIGS. 7a to 7d show a method for forming an insulating layer in a printed circuit board fabricated in a parallel manner.

FIG. 7a shows a flat insulator 701 in which release film 702 are attached to both sides of Prepreg 704. The Prepreg has varying thickness depending on its specifications, and the thickness of the release film is in the range of 20-40 μm. The release film used in the present invention may be previously attached to the Prepreg when manufacturing the Prepreg, or may be attached after manufacturing the Prepreg.

Figure 7B:
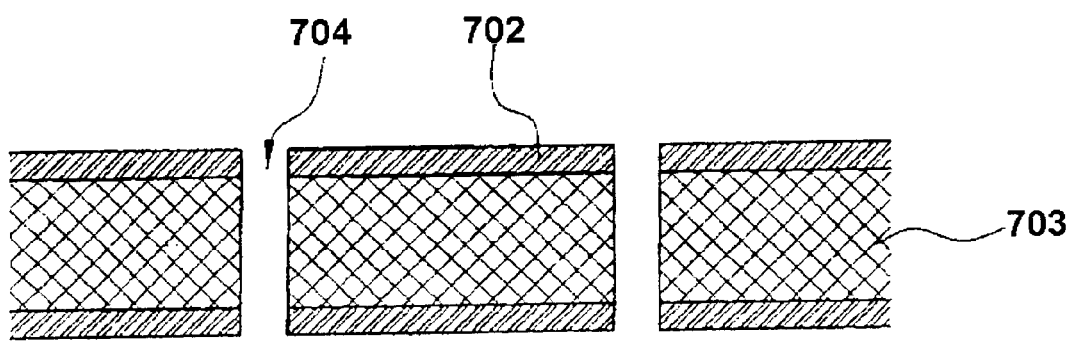

Referring to FIG. 7b, through holes 704 are formed on the flat insulator 701 through drilling. At this step, the through holes have preferably a diameter slightly greater than the via holes of the circuit layer, considering connection with the circuit layer.

Figure 7C:
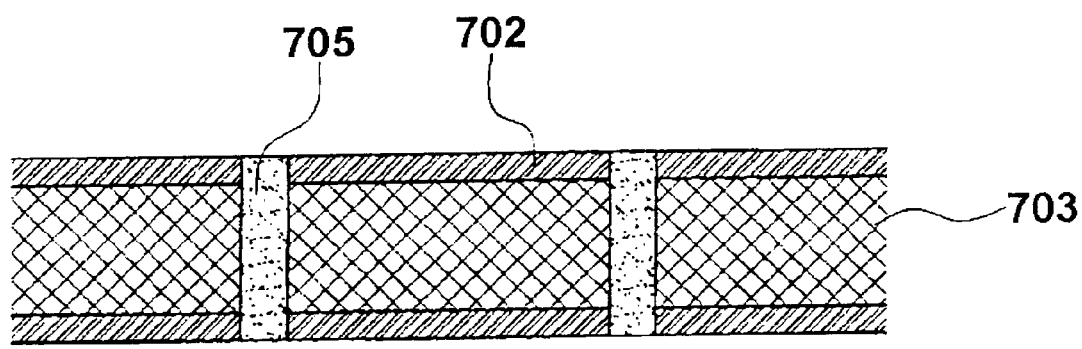
Figure 7D:
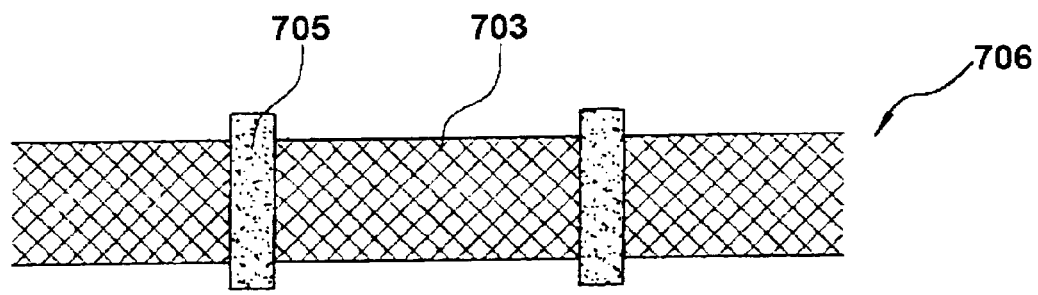

Referring to FIG. 7c, the through holes 704 are filled up with a paste 705. Referring to FIG. 7d, the release film 702 is removed to form an insulating layer 706.

Figure 9:
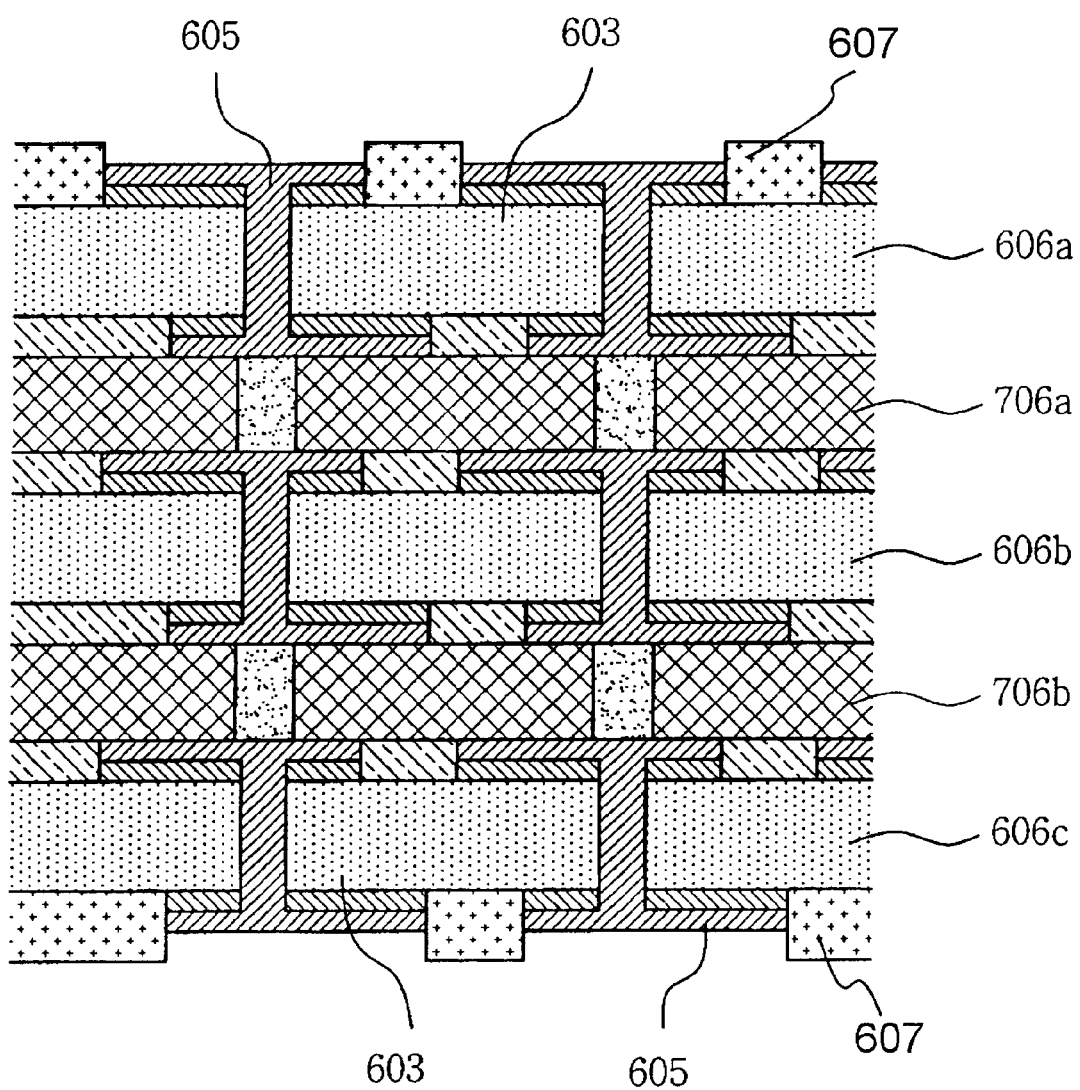
FIG. 9 shows a process for forming a solder resist pattern in a 6-layered printed circuit board fabricated in accordance with another embodiment of the present invention.

The insulating layer 706 thus formed will be used as any one of insulating layers 706a and 706b, which will be shown in FIG. 9.

Then, the circuit layer formed in accordance with the method shown in FIGS. 6a to 6f, and the insulating layer formed in accordance with the method as shown in FIGS. 7a to 7d are alternatively disposed.

Methods such as targeting and trimming, etc., are used to exactly adjust and match the via holes formed in the circuit layer and the insulating layer each other.

Figure 8:
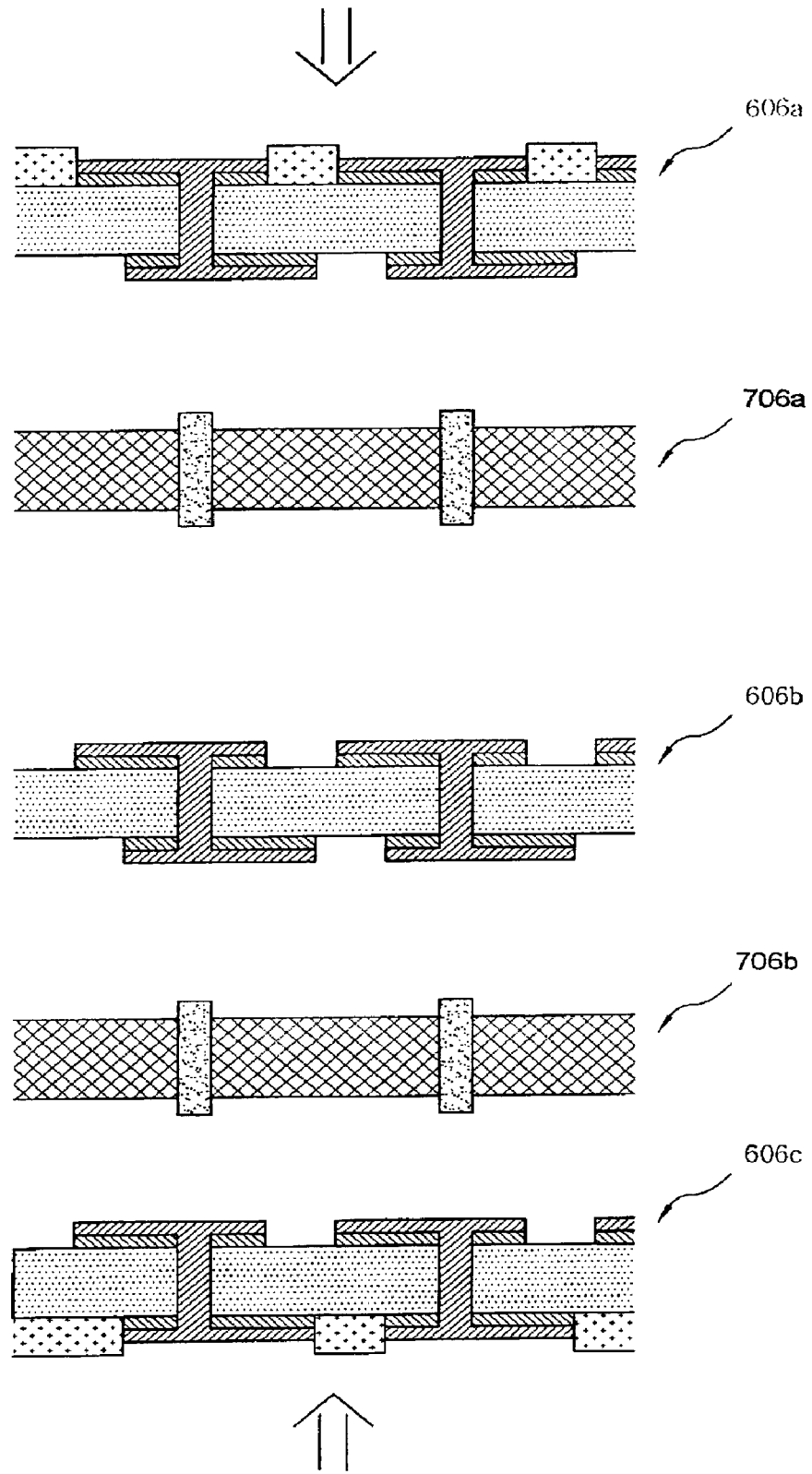
FIG. 8 shows the lamination of a circuit layer and an insulating layer in a printed circuit board fabricated in a parallel manner.

As shown in FIG. 8, the disposed circuit layer and insulating layer are pressed to laminate them at one time in a direction indicated by an arrow using a press to fabricate a 6-layered MLB.

As the press used to fabricate the respective layers into one printed circuit board, a hot press is most widely used. The pressing using the hot press is commonly carried out by charging a laminated substrate into a case, inserting the case into a hot plate at upper and lower parts of a vacuum chamber, and pressurizing/heating the laminated substrate. The hot pressing is also called a vacuum hydraulic lamination (VHL) process.

The multilayer printed circuit board fabricated in accordance with a build-up process has a structure that insulating layers are laminated on a double-sided printed circuit board, and one-sided printed circuit substrates are laminated layer-by-layer thereon. The multilayer printed circuit board fabricated in accordance with a parallel process has a structure in which an insulating layer is sandwiched between a plurality of double-sided printed circuit boards.

In addition to the above embodiments, so long as a circuit pattern is formed on a substrate and a solder resist pattern is formed thereon to protect the circuit pattern, the methods of the present invention are not particularly limited.

As apparent from the above description, the present invention provides a solder resist printing process which is capable of replacing conventional solder resist printing processes requiring a number of steps and apparatuses.

In addition, according to the present invention, low manufacturing costs can be achieved due to a simplified process. The use of a low cost insulating thermosetting resin in the present invention contributes to cost-effectiveness.

Furthermore, since the solder resist printing process of the present invention can replace conventional solder resist printing processes, the time required for fabricating PCBs is reduced.

Recent appearance of high performance lasers improves the accuracy of pattern. Since the laser processing apparatus used in the present invention occupies a relatively small space compared to the photosensitive solder resist printing process line, space utilization is high.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a solder resist pattern comprising the steps of:
   pre-treating both sides of a double-sided printed circuit board to produce first and second pre-treated sides on first and second sides of the printed circuit board, wherein pre-treating includes scrubbing;
   laminating a semi-cured thermosetting film on the first and second pre-treated sides of the printed circuit board to produce first and second semi-cured films on the first and second sides of the printed circuit board, wherein the thermosetting film is the outermost surface of the printed circuit board; and
   irradiating a laser beam to the first and second semi-cured films according to a solder resist mask pattern to selectively remove the first and second films to expose circuit patterns to be brazed and leaving the thermosetting film as a solder resist mask over areas other than the circuit patterns to be brazed, the solder resist mask pattern having been previously designed prior to irradiating.

2. A method for forming a solder resist pattern comprising the steps of:
   pre-treating both sides of a double-sided printed circuit board to produce first and second pre-treated sides on first and second sides of the printed circuit board, wherein pre-treating includes scrubbing;
   laminating a semi-cured thermosetting film on the first and second pre-treated sides of the printed circuit board to produce first and second semi-cured films on the first and second sides of the printed circuit board wherein the thermosetting film is the outermost surface of the printed circuit board;

curing the first and second semi-cured films to produce first and second cured films on the first and second sides of the printed circuit board; and irradiating a laser beam to the first and second cured films according to a solder resist mask pattern to selectively remove the first and second films to expose circuit patterns to be brazed and leaving the thermosetting film as a solder resist mask over areas other than the circuit patterns to be brazed, the solder resist mask pattern having been previously designed prior to irradiating.

3. A method for forming a solder resist pattern comprising the steps of:

pre-treating a portion exposed from a plurality of layers constituting a multilayer printed circuit board fabricated by a buildup process to produce a pretreated portion;

laminating a semi-cured thermosetting film on the pre-treated portion to produce a laminated semi-cured thermosetting film, wherein the thermosetting film is the outermost surface of a layer; and irradiating a laser beam to the laminated semi-cured thermosetting film according to a solder resist mask pattern to selectively remove the thermosetting film to expose circuit patterns to be brazed and leaving the thermosetting film as a solder resist mask over areas other than the circuit patterns to be brazed.

4. The method for forming a solder resist pattern according to claim 3, wherein the pretreatment includes scrubbing.

5. A method for forming a solder resist pattern comprising the steps of:

pre-treating a portion exposed from a plurality of layers constituting a multilayer printed circuit board fabricated by a buildup process to produce a pretreated portion;

laminating a semi-cured thermosetting film on the pre-treated portion to produce a laminated semi-cured thermosetting film, wherein the thermosetting film is the outermost surface of a layer;

curing the laminated semi-cured thermosetting film to produce a laminated cured thermosetting film; and irradiating a laser beam to the laminated cured thermosetting film according to a solder resist mask pattern to selectively remove the laminated cured thermosetting film to expose circuit patterns to be brazed and leaving the thermosetting film as a solder resist mask over areas other than the circuit patterns to be brazed.

6. A method for forming a solder resist pattern on an outer layer in the fabrication of a multilayer printed circuit board using the parallel process comprising the steps of:

pre-treating an outer layer having an exposed surface to produce a pretreated surface;

laminating a semi-cured thermosetting film on the pre-treated surface to produce a laminated semi-cured thermosetting film, wherein the thermosetting film is the outermost surface of the outer layer; and irradiating a laser beam to the laminated semi-cured thermosetting film according to a solder resist mask pattern to selectively remove the thermosetting film to expose circuit patterns to be brazed and leaving the thermosetting film as a solder resist mask over areas other than the circuit patterns to be brazed.

7. The method for forming a solder resist pattern according to claim 6, wherein the pre-treatment includes scrubbing.

8. A method for forming a solder resist pattern on an outer layer in the fabrication of a multilayer printed circuit board using the parallel process comprising the steps of:

pre-treating an outer layer having an exposed surface to produce a pretreated surface;

laminating a semi-cured thermosetting film on the pre-treated portion to produce a laminated semi-cured thermosetting film, wherein the thermosetting film is the outermost surface of the outer layer;

curing the laminated semi-cured thermosetting film to produce a laminated cured thermosetting film; and irradiating a laser beam to the laminated cured thermosetting film according to a solder resist mask pattern to selectively remove the laminated cured thermosetting film to expose circuit patterns to be brazed and leaving the thermosetting film as a solder resist mask over areas other than the circuit patterns to be brazed.

9. The method of claim 1, wherein the laser is a yttrium aluminum garnet laser, excimer laser, or carbon dioxide laser.

10. The method of claim 3, wherein the laser is a yttrium aluminum garnet laser, excimer laser, or carbon dioxide laser.

11. The method of claim 6, wherein the laser is a yttrium aluminum garnet laser, excimer laser, or carbon dioxide laser.

12. A method for forming a solder resist pattern, comprising:

pre-treating both sides of a double-sided printed circuit board to provide pre-treated sides of a printed circuit board;

applying a semi-cured thermosetting film on the pre-treated sides of the printed circuit board to provide a thermoset film on the printed circuit board, wherein the thermoset film is the outermost surface of the printed circuit board; and following applying the semi-cured thermosetting film, irradiating a laser beam on the semi-cured thermoset film to selectively remove the thermoset film to expose circuit patterns to be brazed and leaving the thermoset film as a solder resist mask over areas other than the circuit patterns to be brazed.

13. The method of claim 12, wherein pre-treating includes scrubbing.

14. A method for forming a solder resist pattern, comprising:

pre-treating both sides of a double-sided printed circuit board to provide pre-treated sides of a printed circuit board;

applying a semi-cured thermosetting film on the pre-treated sides of the printed circuit board to provide a thermoset film on the printed circuit board, wherein the thermoset film is the outermost surface of the printed circuit board;

curing the thermosetting film to provide a cured thermoset film; and following curing, irradiating a laser beam on the cured thermoset film to selectively remove the thermoset film to provide a solder resist pattern expose circuit patterns to be brazed and leaving the thermoset film as a solder resist mask over areas other than circuit patterns to be brazed.

15. A method for forming a solder resist pattern, comprising:

obtaining a substrate with an exposed circuit pattern on the surface thereof;

treating the substrate and the exposed circuit pattern to provide a treated circuit pattern;

applying a semi-cured thermosetting film to the substrate to cover the exposed and treated circuit pattern to provide a thermosetting film as the outermost surface layer of the substrate; and following applying the thermosetting film, removing the semi-cured thermosetting film in selected areas with a laser beam to expose circuit patterns to be brazed and leaving the thermosetting film as a solder resist mask over areas other than the circuit patterns to be brazed.

16. The method of claim 15, comprising obtaining two of the substrates having a solder resist mask and placing one or more insulating layers between said two substrates so that the solder resist mask patterns of said two substrates are the outermost layers, then pressing the two substrates and one or more insulating layers to fabricate a multi-layer printed circuit board.

17. The method of claim 15, wherein the substrate comprises a double-sided printed circuit board having circuit patterns on both outermost sides of the printed circuit board and the thermosetting film is applied to cover the circuit patterns on both outermost surfaces and the thermosetting film on both sides is irradiated with a laser beam to provide a solder resist mask pattern on both outermost sides of the double-sided printed circuit board.

18. The method of claim 6, further comprising obtaining a second outer layer having a solder resist mask pattern, placing one or more insulating layers between said two outer layers so that the solder resist mask patterns of said two outer layers are the outermost layers, then pressing the two outer layers and the one or more insulating layers to fabricate a multilayered printed circuit board.

19. The method of claim 8, further comprising obtaining a second outer layer having a solder resist mask pattern, placing one or more insulating layers between said two outer layers so that the solder resist mask patterns of said two outer layers are the outermost layers, then pressing the two outer layers and the one or more insulating layers to fabricate a multilayered printed circuit board.

* * * * *

UNITED STATES PATENT AND TRADEMARK OFFICE
CERTIFICATE OF CORRECTION

PATENT NO. : 7,435,352 B2  Page 1 of 1
APPLICATION NO. : 10/677182
DATED : October 14, 2008
INVENTOR(S) : J.-S. Mok et al.

It is certified that error appears in the above-identified patent and that said Letters Patent is hereby corrected as shown below:

| COLUMN | LINE | ERROR |
|---|---|---|
| 12 (Claim 14) | 58 | before "expose circuit patterns" delete "provide a solder resist pattern" |

Signed and Sealed this

Fourth Day of August, 2009

JOHN DOLL
*Acting Director of the United States Patent and Trademark Office*